United States Patent
Furumiya

(10) Patent No.: US 6,825,879 B1
(45) Date of Patent: Nov. 30, 2004

(54) SOLID-STATE IMAGE SENSING DEVICE AND METHOD OF DRIVING THE SAME

(75) Inventor: Masayuki Furumiya, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/249,109

(22) Filed: Feb. 12, 1999

(30) Foreign Application Priority Data

Feb. 18, 1998 (JP) .......................................... 10-035730

(51) Int. Cl.[7] ...................... H04N 5/335; H01L 27/148; G11C 19/28
(52) U.S. Cl. .......................... 348/311; 257/242; 377/63
(58) Field of Search ................................ 348/311, 316, 348/319, 303, 302; 257/242, 215; 377/61–63; 250/208.1

(56) References Cited

U.S. PATENT DOCUMENTS

| | | | | |
|---|---|---|---|---|
| 5,105,450 A | * | 4/1992 | Yamada ...................... | 348/303 |
| 5,141,890 A | * | 8/1992 | Haken ......................... | 257/338 |
| 5,315,137 A | * | 5/1994 | Asaumi et al. ............. | 257/250 |
| 5,801,409 A | * | 9/1998 | Nam .......................... | 257/231 |
| 6,100,553 A | * | 8/2000 | Park et al. .................. | 257/249 |
| 6,222,586 B1 | * | 4/2001 | Nagakawa .................. | 348/311 |

FOREIGN PATENT DOCUMENTS

| JP | 64-89863 | 4/1989 |
|---|---|---|
| JP | 7-283387 | 10/1995 |

OTHER PUBLICATIONS

T. Okutani et al, "A 1/3–inch 330k Square–Pixel Progressive–Scan IT–CCD Image Sensor", 1995 ITE Annual Convention, pp. 93 and 94.

* cited by examiner

*Primary Examiner*—Andrew Christensen
*Assistant Examiner*—Nhan Tran
(74) *Attorney, Agent, or Firm*—Foley & Lardner LLP

(57) ABSTRACT

In a solid-state image sensing device, photoelectric conversion elements are two-dimensionally arrayed in a matrix on a semiconductor substrate. A transfer gate portion is arranged adjacent to each photoelectric conversion element to read signal charges stored in the photoelectric conversion element. A vertical CCD is arranged adjacent to the transfer gate portion to transfer the signal charges read from the photoelectric conversion element in a vertical direction. A horizontal CCD transfers the signal charges transferred from the vertical CCD in a horizontal direction. A charge detection portion detects the signal charges transferred from the horizontal CCD and outputs them. Four vertical transfer electrodes are formed adjacent to each other on the vertical CCD in a vertical transfer direction of the signal charges. The vertical transfer electrodes include first and second transfer electrodes adjacent to each other in the vertical transfer direction. The first vertical transfer electrode has a larger length than that of the second vertical transfer electrode and serves as a transfer electrode for controlling the transfer gate portion. A driving method therefor is also disclosed.

5 Claims, 12 Drawing Sheets

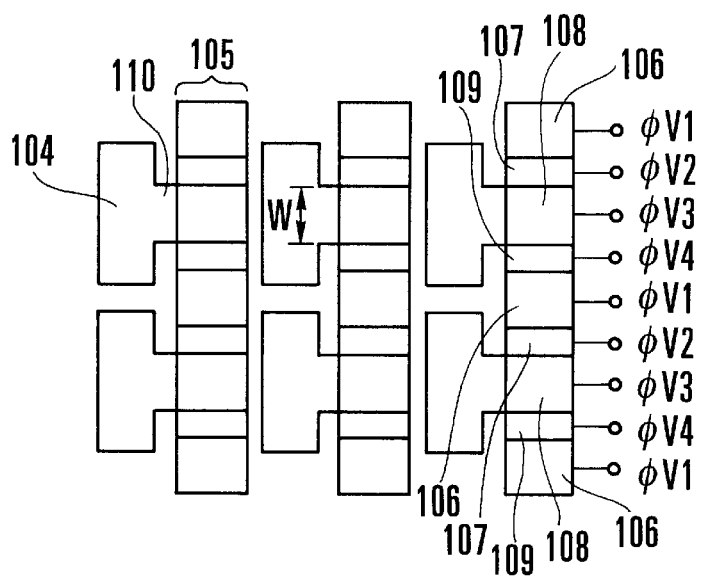
F I G. 1
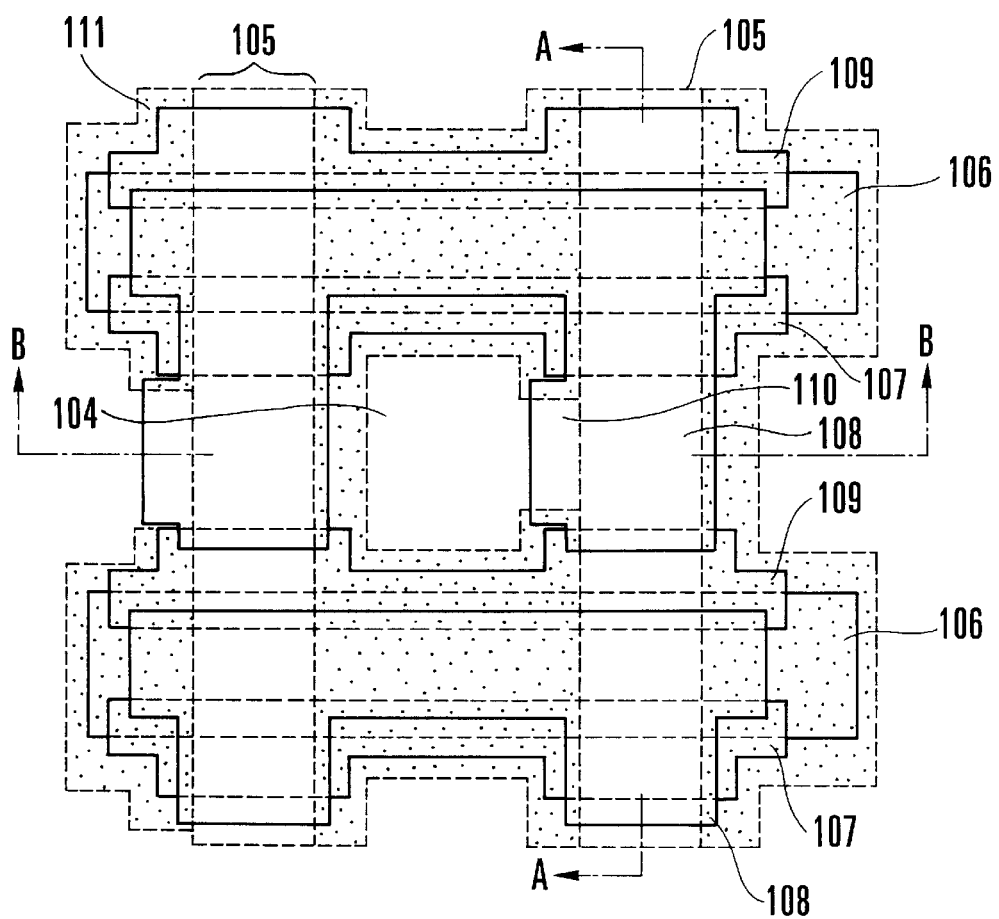
F I G. 2

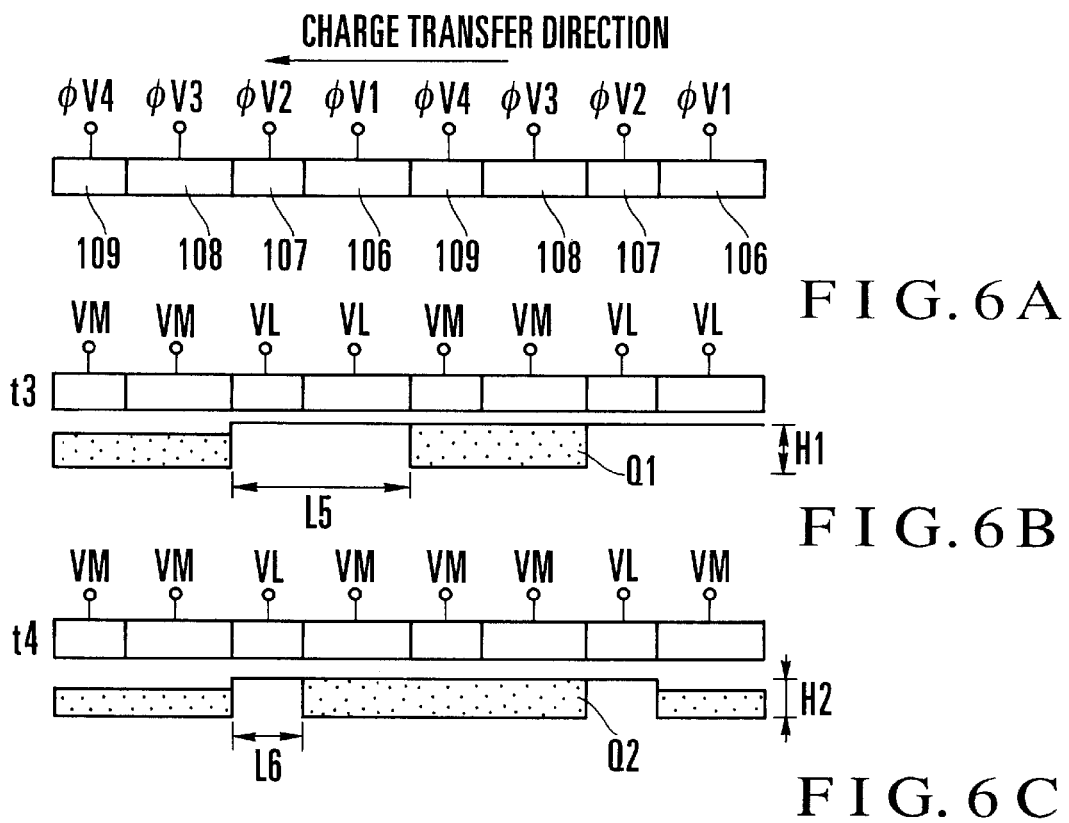
FIG. 6A
FIG. 6B
FIG. 6C
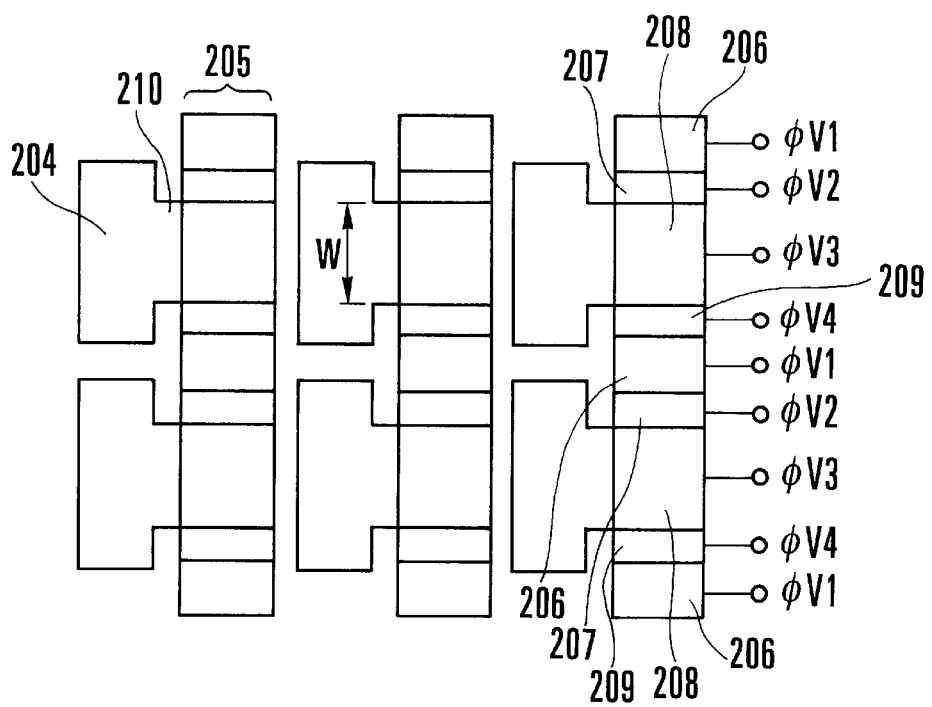
FIG. 7

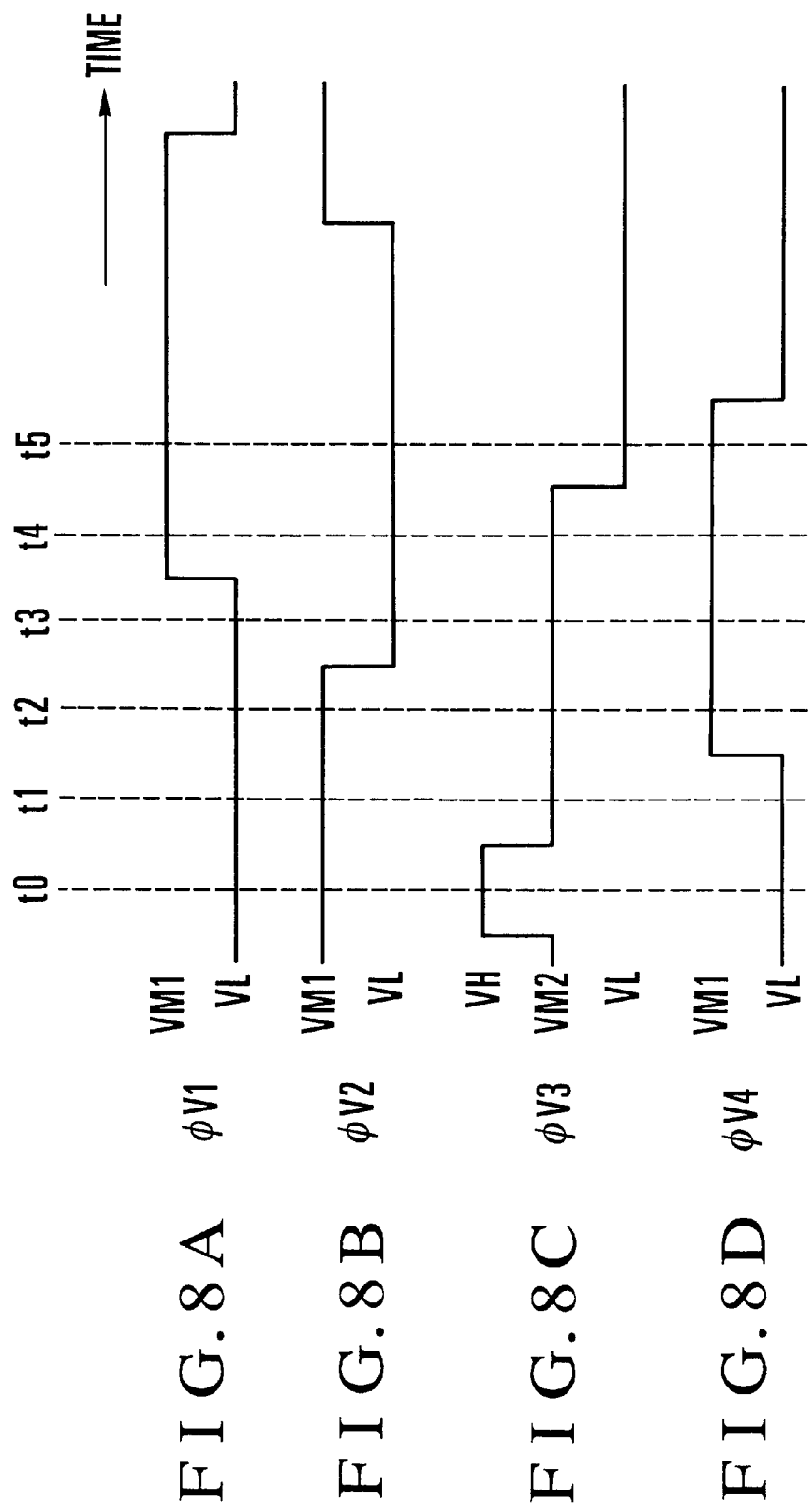

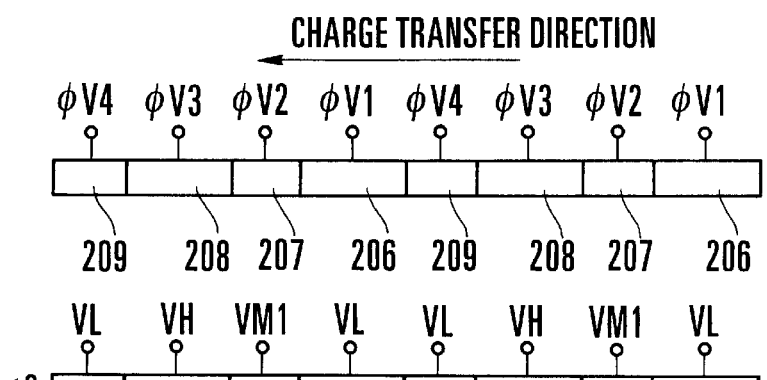
FIG. 9A
FIG. 9B
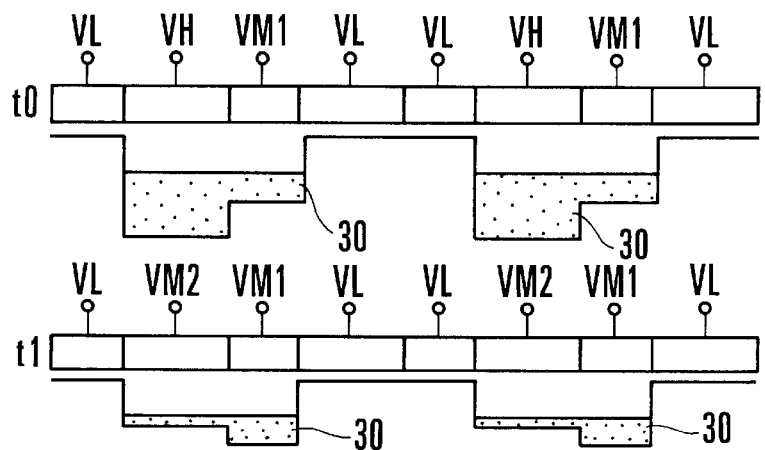
FIG. 9C
FIG. 9D
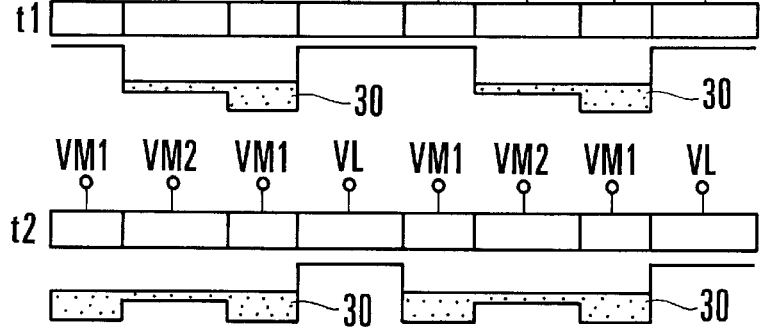
FIG. 9E
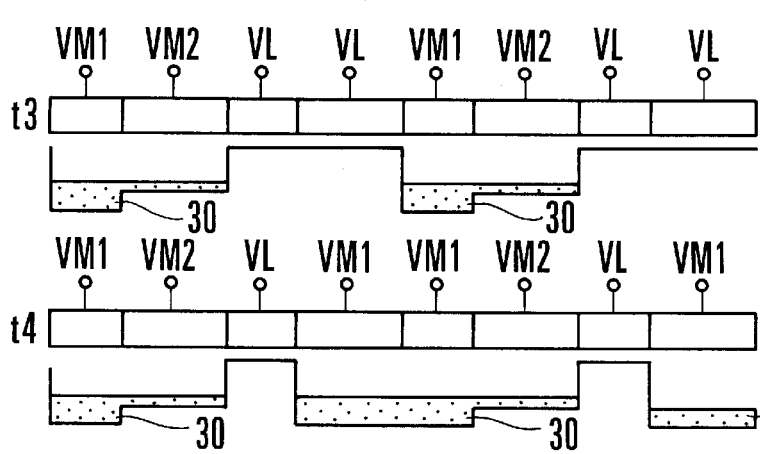
FIG. 9F
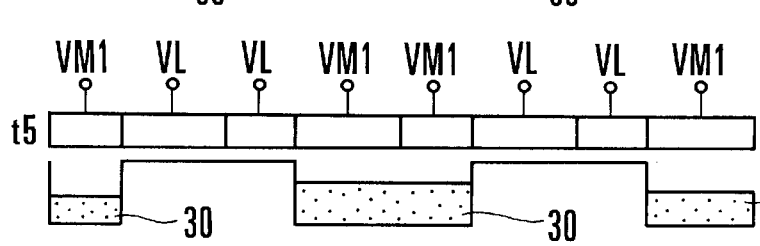
FIG. 9G

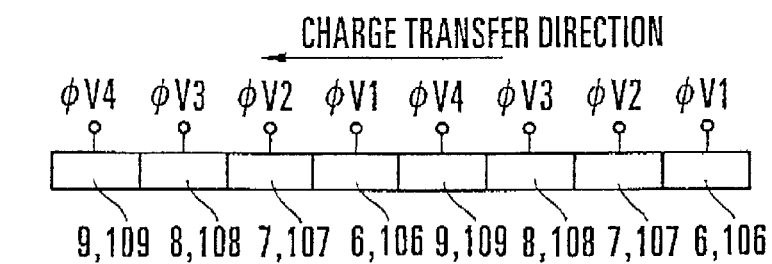
FIG. 15A PRIOR ART
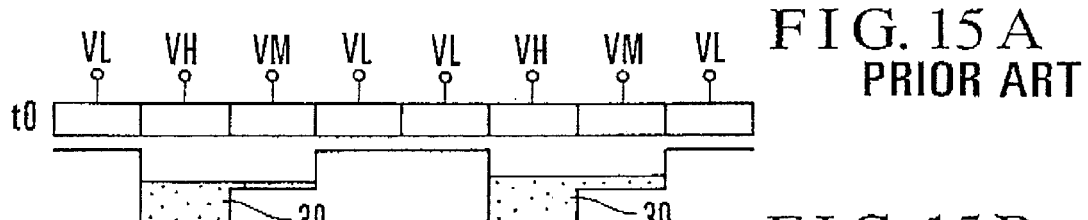
FIG. 15B PRIOR ART
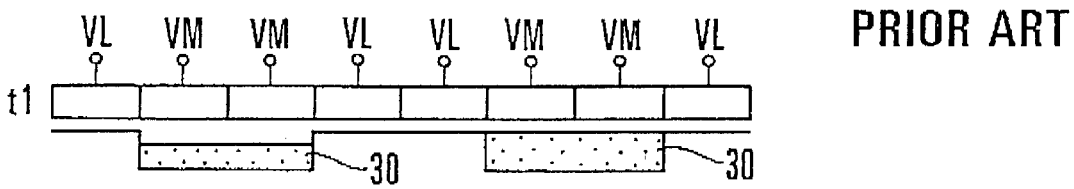
FIG. 15C PRIOR ART
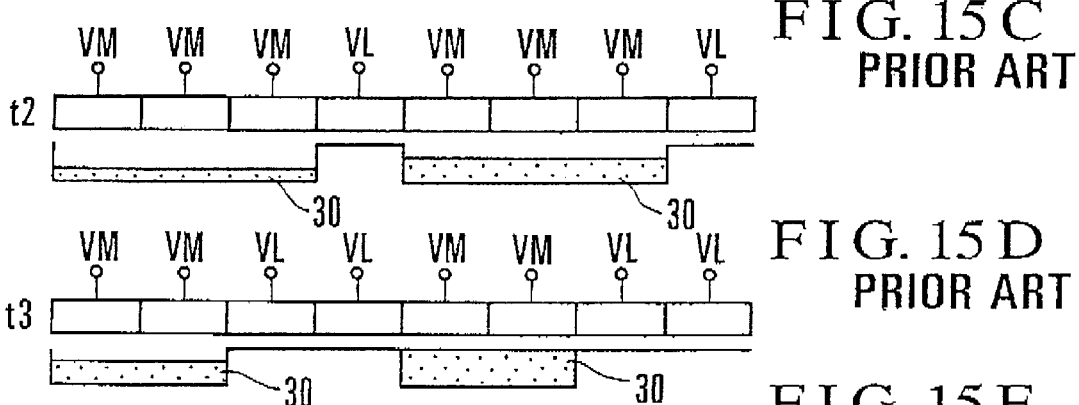
FIG. 15D PRIOR ART
FIG. 15E PRIOR ART
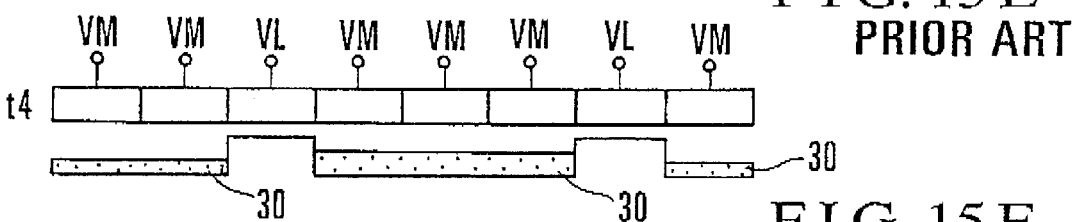
FIG. 15F PRIOR ART
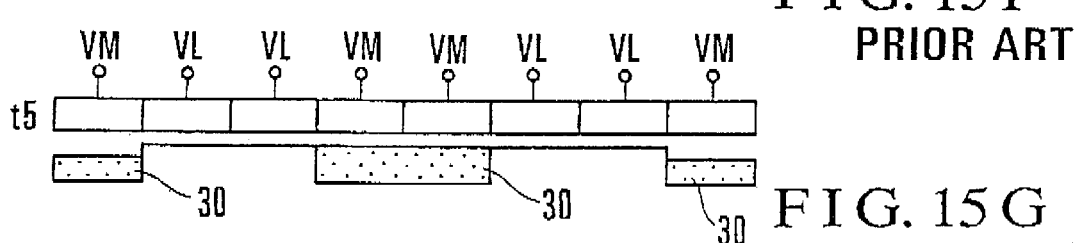
FIG. 15G PRIOR ART

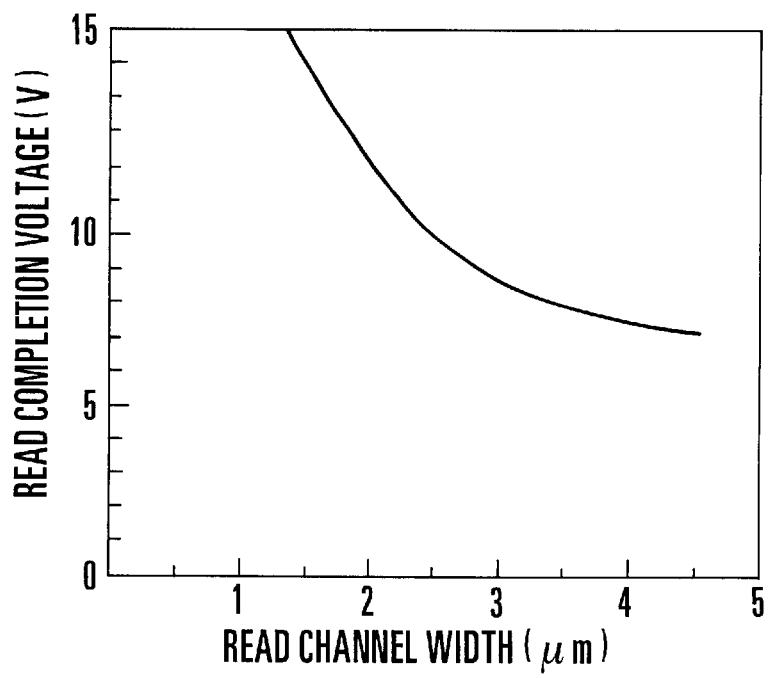
F I G. 16
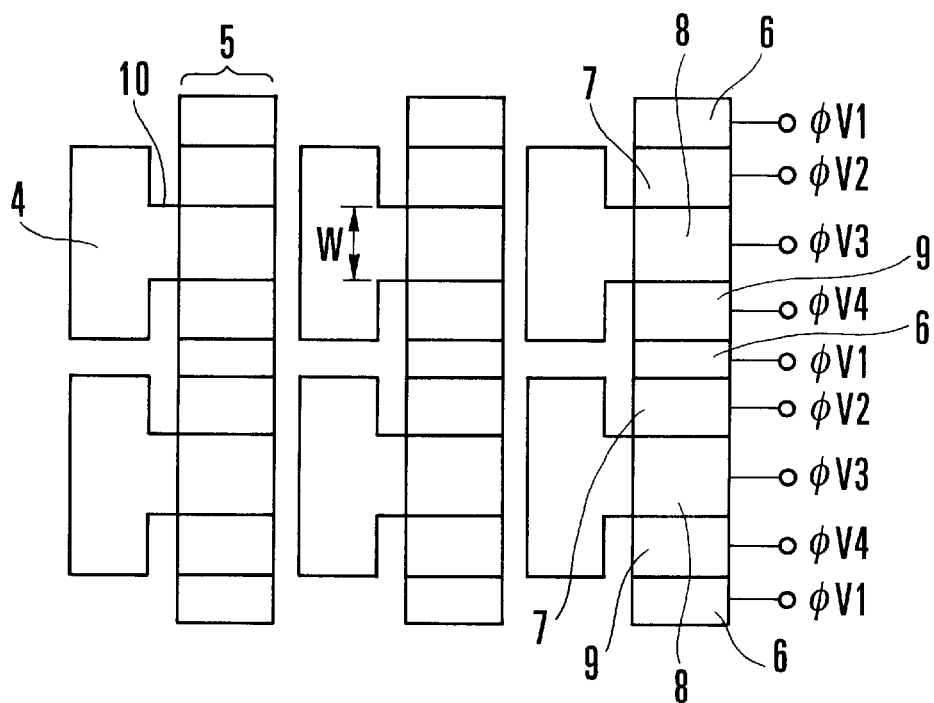
F I G. 17

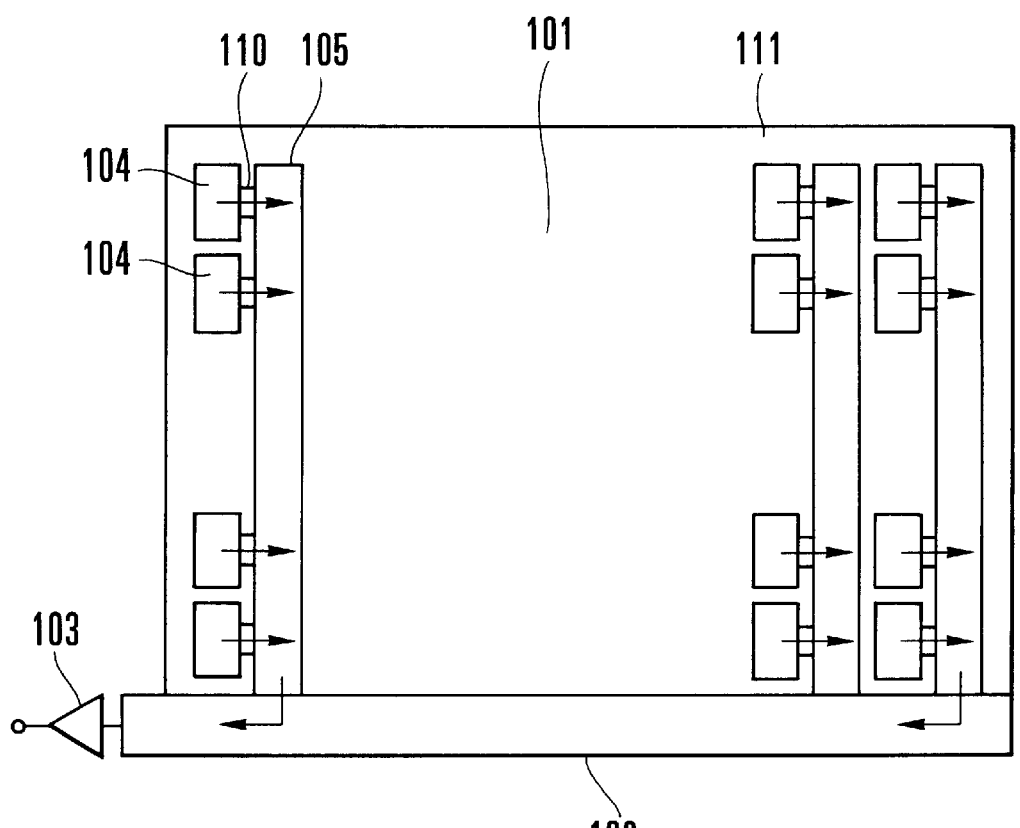
F I G. 19

SOLID-STATE IMAGE SENSING DEVICE AND METHOD OF DRIVING THE SAME

BACKGROUND OF THE INVENTION

The present invention relates to an all-pixel readout-type solid-state image sensing device and a method of driving the same and, more particularly, to the structure of a vertical transfer electrode for transferring read signal charges to a vertical CCD (Charge Coupled Device) and setting of a driving voltage to be applied to the vertical transfer electrode.

In recent years, video cameras for business or private use, which use solid-state image sensing devices, are becoming popular. These conventional video cameras for business or private use employ the interlaced scheme (interfaced scanning scheme) with which horizontal signal lines are scanned every other line to cope with the TV scheme (NTSC or PAL).

Meantime, image input cameras for personal computers have been extensively developed recently. Cameras of this type employ, as the horizontal scanning scheme, the non-interlaced scheme to obtain high-resolution still images and easily output images to computer displays. The solid-state image sensing device used in a camera of the non-interlaced scheme must simultaneously and independently read signal charges of all pixels. This read scheme is called all-pixel readout or progressive scan (reference: Okuya et al., "A ⅓-inch 330 k Square-Pixel Progressive-Scan IT-CCD Image Sensor", 1995 ITE Annual Convention, pp. 93–94, 1995).

FIG. 10 shows a conventional all-pixel readout-type interline CCD solid-state image sensing device.

This image sensing device is mainly divided into an image sensing portion 1, a horizontal CCD 2, and an output portion (charge detection portion) 3. In the image sensing portion 1, a plurality of photodiodes 4 for storing photoelectrically converted signal charges are two-dimensionally arrayed in a matrix. Vertical CCDs 5 for transferring signal charges in the vertical direction are arranged between the photodiode lines. A transfer gate region 10 for reading signal charges from each photodiode 4 to a corresponding vertical CCD 5 is formed between the photodiode 4 and the vertical CCD 5. In the image sensing portion 1, a region other than the photodiodes 4, vertical CCDs 5, and transfer gate regions 10 is an element isolation region 11.

The operation of the solid-state image sensing device with the above arrangement will be described. Signal charges photoelectrically converted by the photodiodes 4 within a predetermined period are read to the vertical CCDs 5 through the transfer gate regions 10. The signal charges read to the vertical CCDs 5 are transferred to the horizontal CCD 2 in units of horizontal lines. The signal charges transferred to the horizontal CCD 2 are transferred to the output portion 3 and detected.

FIG. 11 shows the photodiodes 4 and vertical CCDs 5 of the solid-state image sensing device shown in FIG. 10. FIG. 11 shows only 3×2 pixels in the horizontal and vertical directions. FIG. 12 shows enlarged details of the structure shown in FIG. 11. FIG. 13 shows a section taken along a line C—C in FIG. 12.

Referring to FIGS. 11 to 13, the vertical CCDs 5 consisting of polysilicon and having vertical transfer electrodes 6, 7, 8, and 9 are arranged between the photodiode lines. The four vertical transfer electrodes 6 to 9 are commonly formed across the vertical CCDs 5 in units of photodiodes 4. The vertical transfer electrodes 8 also serve as transfer electrodes for reading signal charges from the photodiodes 4 to the vertical CCDs 5. Referring to FIG. 13, insulating films (not shown) are formed between a semiconductor substrate 12 and the vertical transfer electrodes 6 to 9 and among the vertical transfer electrodes. Four-phase driving pulses φV1, φV2, φV3, and φV4 are applied to the vertical transfer electrodes 6, 7, 8, and 9, respectively.

A method of driving the vertical CCDs 5 of the above-described solid-state image sensing device of all-pixel readout type will be described next.

FIGS. 14A to 14D show the waveforms of driving pulses applied to the vertical transfer electrodes 6 to 9 at the time of read and during the vertical transfer period immediately after the read. FIGS. 15A to 15G show potentials representing signal charge storage and transfer states at times t0 to t5 in FIGS. 14A to 14D. The higher the driving pulse voltage becomes, the higher the potential becomes. In FIGS. 15A to 15G, the potential becomes high toward the lower side of the drawings. In other words, the potential with respect to electrons rises toward the upper side of the drawings.

At time t0, the driving pulse φV3 of high level VH is applied to the vertical transfer electrode 8 also serving as a transfer electrode (FIG. 14C) to read signal charges 30 from the photodiode 4 to the vertical CCD 5, as shown in FIG. 15B. At this time, the driving pulses φV1 and φV4 are at low level VL (FIGS. 14A and 14D), and the driving pulse φV2 is at intermediate level VM (VL<VM<VH) (FIG. 14B).

At time t1, the driving pulse φV3 applied to the vertical transfer electrode 8 is set at intermediate level VM (FIG. 14C), so signal charges are stored only at the lower portions of the vertical transfer electrodes 7 and 8 corresponding to the driving pulses φV2 and φV3, respectively, as shown in FIG. 15C.

At time t2, the driving pulse φV4 applied to the vertical transfer electrode 9 is set at intermediate level VM (FIG. 14D), so signal charges are stored only at the lower portions of the vertical transfer electrodes 7, 8, and 9 corresponding to the driving pulses φV2, φV3, and φV4, respectively, as shown in FIG. 15D.

At time t3, the driving pulse φV2 applied to the vertical transfer electrode 7 is set at low level VL (FIG. 14B), so signal charges are stored only at the lower portions of the vertical transfer electrodes 8 and 9 corresponding to the driving pulses φV3 and φV4, respectively, as shown in FIG. 15E.

At time t4, the driving pulse φV1 applied to the vertical transfer electrode 6 is set at intermediate level VM (FIG. 14A), so signal charges are stored only at the lower portions of the vertical transfer electrodes 8, 9, and 6 corresponding to the driving pulses φV3, φV4, and φV1, respectively, as shown in FIG. 15F.

At time t5, the driving pulse φV3 applied to the vertical transfer electrode 8 is set at low level VL (FIG. 14C), so signal charges are stored only at the lower portions of the vertical transfer electrodes 9 and 6 corresponding to the driving pulses φV4 and φV1, respectively, as shown in FIG. 15G.

By sequentially applying the driving pulses, the signal charges 30 are transferred to the left of the drawings, as shown in FIGS. 15A to 15G. Such a driving pulse application method is called double clocking. As the characteristic feature of this method, two or more electrodes are always set at intermediate level VM independently of the states during transfer.

The maximum amount of charges to be transferred by the vertical CCD 5 is limited by the state wherein the driving pulses applied to two vertical transfer electrodes adjacent in the vertical transfer direction are at intermediate level VM, and the driving pulses applied to the remaining vertical transfer electrodes are at low level VL, as at time t1, t3, or t5. That is, the maximum transfer charge amount of the vertical CCD 5 is determined by the amount of charges to be stored in two electrodes adjacent in the vertical transfer direction.

The signal charge read from the photodiode 4 to the vertical CCD 5 will be examined below. Signal charges stored in the photodiode 4 are read by applying a driving pulse of high level VH to the vertical transfer electrode 8 also serving as a transfer electrode. The read voltage required for a complete read depends on a read channel width W of the transfer gate region 10. More specifically, when the read channel width W is large, the read is complete with a low applied voltage.

On the other hand, when the read channel width W is small, the channel potential becomes low because of the narrow channel effect (i.e., the threshold voltage becomes high). Hence, unless a higher voltage is applied to the vertical transfer electrode 8 serving as a transfer electrode, a complete read cannot be performed.

As shown in FIG. 11, the four vertical transfer electrodes 6 to 9 are formed for each photodiode. In this case, when a vertical transfer electrode is equally divided such that all the vertical transfer electrodes 6 to 9 have equal electrode lengths in the transfer direction (L1=L2=L3=L4 in FIG. 13), the electrode length is about ¼ the pixel size. For example, when the pixel size is 6.7 $\mu m^2$, and the electrode interval is 0.2 $\mu m$, each of the electrode lengths L1, L2, L3, and L4 is 1.475 $\mu m$. Hence, the read channel width W (=the electrode length L3 of the vertical transfer electrode 8) in the transfer gate region 10 is 1.475 $\mu m$ or less.

FIG. 16 shows a simulation result of the dependence of the read completion voltage on the read channel width W. As is apparent from FIG. 16, when the read channel width W in the transfer gate region 10 is 1.475 $\mu m$, the read completion voltage is as high as about 15.5 V. When manufacturing variations are taken into consideration, the read pulse must be set at a voltage of 17.5 V or more, resulting in difficulty in lowering the voltage of a camera.

To avoid such an increase in read completion voltage, the following method can be employed. FIG. 17 shows the photodiodes 4 and vertical CCDs 5 of a CCD solid-state image sensing device having an increased read channel width W in the transfer gate region 10. FIG. 17 shows only 3×2 pixels in the horizontal and vertical directions.

As the characteristic feature of the solid-state image sensing device shown in FIG. 17, the vertical transfer electrode 8 which is also used as a transfer electrode has a larger electrode length in the vertical transfer direction than the electrode lengths of the remaining vertical transfer electrodes. With this arrangement, the read channel width W in the transfer gate region 10 can be made larger, and a decrease in read voltage can be expected.

FIGS. 18A to 18G show potentials representing signal charge storage and transfer states in the solid-state image sensing device having the electrode structure shown in FIG. 17. The method of driving the vertical CCD 5 is the same as that of the solid-state image sensing device having the electrode structure shown in FIG. 11, and a detailed description thereof will be omitted.

In this solid-state image sensing device, the electrode lengths of the three vertical transfer electrodes 6, 7, and 9 other than the transfer electrode 8 in the vertical transfer direction are smaller than the electrode length of the transfer electrode 8. For this reason, at time t5, charges are stored at the lower portions of the two vertical transfer electrodes 6 and 9 having smaller electrode lengths. Since the maximum transfer charge amount of the vertical CCD 5 is limited by this charge storage state, the dynamic range becomes narrower than that of the solid-state image sensing device having the electrode structure shown in FIG. 11.

As described above, in the conventional solid-state image sensing device, the voltage can hardly be lowered. In addition, in the solid-state image sensing device whose read channel width in the transfer gate region is increased to realize a low voltage, the dynamic range becomes narrow.

SUMMARY OF THE INVENTION

It is an object of the present invention to provide a solid-state image sensing device capable of realizing a low voltage without decreasing the dynamic range (maximum transfer charge amount), and a method of driving the same.

In order to achieve the above object, according to the present invention, there is provided a solid-state image sensing device comprising photoelectric conversion elements two-dimensionally arrayed in a matrix on a semiconductor substrate, a transfer gate portion arranged adjacent to each of the photoelectric conversion elements to read signal charges stored in the photoelectric conversion element, a vertical CCD arranged adjacent to the transfer gate portion to transfer the signal charges read from the photoelectric conversion element in a vertical direction, a horizontal CCD for transferring the signal charges transferred from the vertical CCD in a horizontal direction, a charge detection portion for detecting the signal charges transferred from the horizontal CCD and outputting the signal charges, and four vertical transfer electrodes formed adjacent to each other on the vertical CCD in a vertical transfer direction of the signal charges, the vertical transfer electrodes including first and second transfer electrodes adjacent to each other in the vertical transfer direction of the signal charges, and the first vertical transfer electrode having a larger length than that of the second vertical transfer electrode and serving as a transfer electrode for controlling the transfer gate portion.

BRIEF DESCRIPTION OF THE DRAWINGS

FIG. 1 is a plan view showing the schematic arrangement of photodiodes and vertical CCDs shown in FIG. 19;

FIG. 2 is an enlarged plan view of the photodiodes and vertical CCDs shown in FIG. 1;

FIGS. 6A to 6C are views showing potentials so as to explain the reduction restriction of the shorter vertical transfer electrode in the CCD solid-state image sensing device shown in FIG. 1;

FIG. 7 is a plan view showing the schematic arrangement of a CCD solid-state image sensing device according to the second embodiment of the present invention;

FIGS. 8A to 8D are timing charts showing the waveforms of driving pulses applied to vertical transfer electrodes at the time of read and during the vertical transfer period immediately after the read in the CCD solid-state image sensing device shown in FIG. 7;

FIGS. 9A to 9G are views showing potentials representing the signal charges storage and transfer states at the respective time points in FIGS. 8A to 8D;

FIGS. 15A to 15G are views showing potentials representing the signal charges storage and transfer states at the respective time points in FIGS. 14A to 14D;

FIG. 16 is a graph showing a simulation result of the dependence of a read completion voltage on a read channel width;

FIG. 17 is a schematic plan view of photodiodes and vertical CCDs of a solid-state image sensing device having an increased read channel width in a transfer gate region;

FIG. 19 is a plan view of a CCD solid-state image sensing device according to the first embodiment of the present invention.

DESCRIPTION OF THE PREFERRED EMBODIMENTS

Figure 3:
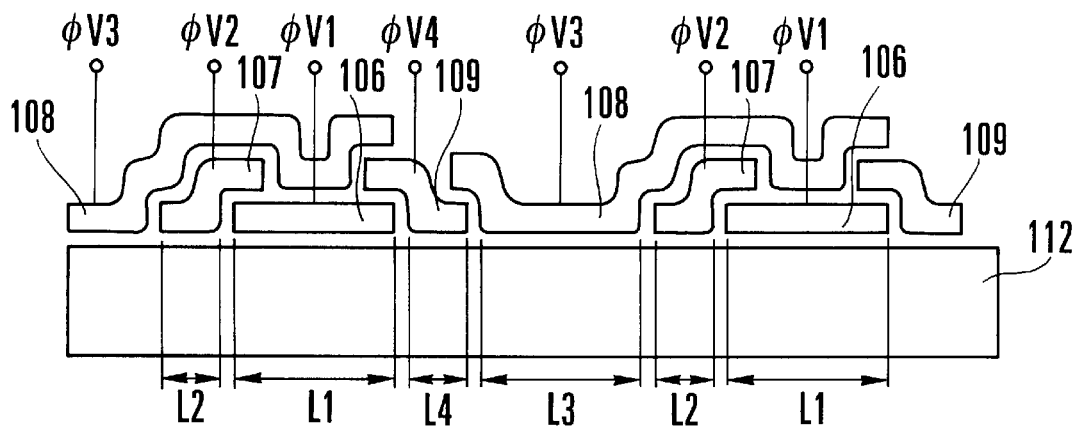
FIG. 3 is a sectional view taken along a line A—A in FIG. 2.

The present invention will be described below in detail with reference to the accompanying drawings.
First Embodiment FIG. 19 shows a CCD solid-state image sensing device according to the first embodiment of the present invention. The image sensing device of this embodiment is mainly divided into an image sensing portion 101, a horizontal CCD 102, and an output portion (charge detection portion) 103. In the image sensing portion 101, a plurality of photodiodes 104 for storing photoelectrically converted signal charges are two-dimensionally arrayed in a matrix. Vertical CCDs 105 for transferring signal charges in the vertical direction are arranged between the photodiode lines. A transfer gate region 110 for reading signal charges from each photodiode 104 to a corresponding vertical CCD 105 is formed between the photodiode 104 and the vertical CCD 105. In the image sensing portion 101, a region other than the photodiodes 104, vertical CCDs 105, and transfer gate regions 110 is an element isolation region 111.

The operation of the solid-state image sensing device with the above arrangement will be described. Signal charges photoelectrically converted by the photodiodes 104 within a predetermined period are read to the vertical CCDs 105 through the transfer gate regions 110. The signal charges read to the vertical CCDs 105 are transferred to the horizontal CCD 102 in units of horizontal lines. The signal charges transferred to the horizontal CCD 102 are transferred to the output portion 103 and detected.

Figure 4:
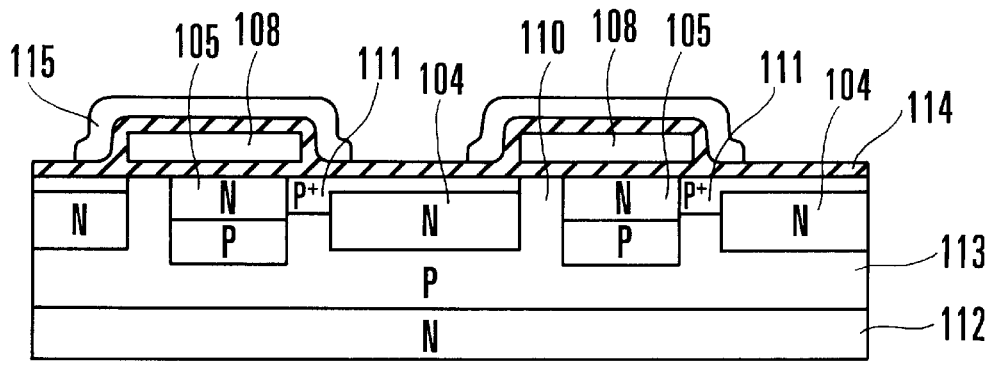
FIG. 4 is a sectional view taken along a line B—B in FIG. 2.

FIG. 1 shows the photodiodes 104 and vertical CCDs 105 of the solid-state image sensing device shown in FIG. 19. FIG. 1 shows only 3×2 pixels in the horizontal and vertical directions. FIG. 2 shows enlarged details of the structure shown in FIG. 1. FIG. 3 shows a section taken along a line A—A in FIG. 2. FIG. 4 shows a section taken along a line B—B in FIG. 2. In FIG. 2, an insulating film and light-shielding film (both will be described later) are not illustrated. In FIG. 3, insulating films (to be described later) between an n-type semiconductor substrate 112 and vertical transfer electrodes 106 to 109 and among the vertical transfer electrodes are not illustrated.

In the solid-state image sensing device of this embodiment, a p-type well 113 is formed on the n-type semiconductor substrate 112, as shown in FIG. 4. The photodiodes (photoelectric conversion elements) 104 two-dimensionally arrayed in a matrix and consisting of an n-type semiconductor are formed on the p-type well 113.

The vertical CCDs 105 of an n-type semiconductor are formed between the photodiode lines. The element isolation region 111 is formed from a p$^+$-type semiconductor. Portions of the p-type well 113 on the semiconductor substrate 112, where no element isolation regions 111 are formed, correspond to the transfer gate portion 110. The vertical transfer electrodes 106, 107, 108, and 109 of polysilicon are formed on this structure.

As shown in FIG. 2, the four vertical transfer electrodes 106 to 109 are commonly formed across the vertical CCDs 105 in units of photodiodes 104. The vertical transfer electrodes 108 also serve as transfer electrodes for reading signal charges from the photodiodes 104 to the vertical CCDs 105.

As shown in FIG. 3, the vertical transfer electrode 106 of polysilicon is formed on the semiconductor substrate 112 via an insulating film (insulating film 114 in FIG. 4). An insulating film (not shown) is formed on the vertical transfer electrode 106, and the vertical transfer electrodes 107 and 109 of polysilicon are formed on this insulating film to partially cover the vertical transfer electrode 106. An insulating film (not shown) is formed on the vertical transfer electrodes 107 and 109, and the vertical transfer electrode 108 of polysilicon is formed on this insulating film to partially cover the vertical transfer electrodes 106, 107, and 109.

After an insulating film is formed to cover the surface of this structure, a light-shielding film 115 is formed to cover portions other than the photodiodes 104, as shown in FIG. 4. Referring to FIG. 3, 4-phase driving pulses φV1, φV2, φV3, and φV4 having difference phases are supplied to the vertical transfer electrodes 106, 107, 108, and 109, respectively, through, e.g., Al interconnections, so the structure functions as an all-pixel readout-type solid-state image sensing device.

As a characteristic feature of the CCD solid-state image sensing element of this embodiment, the sums of electrode lengths of two arbitrary vertical transfer electrodes adjacent in the vertical transfer direction (vertical direction in FIGS. 1 and 2) are equal at any portions in the effective image sensing region (image sensing portion 101 shown in FIG. 19). Additionally, the two vertical transfer electrodes have different electrode lengths, and the vertical transfer electrodes alternately have equal electrode lengths. Furthermore, an electrode length L3 of the vertical transfer electrode 108 which is also used as a transfer electrode is larger than electrode lengths L2 and L4 of the two vertical transfer electrodes 107 and 109 adjacent in the vertical transfer direction.

That is, the vertical transfer electrodes 106 to 109 are repeatedly formed such that the electrode lengths sequentially become large, small, large, small, . . . The electrode lengths of the vertical transfer electrodes 106 to 109 are electrode lengths in the vertical transfer direction. The electrode length in the vertical transfer direction means the length of an electrode portion which opposes the semiconductor substrate 112 via the insulting film (not shown in FIG. 3). With the above electrode structure, the electrode length L3 of the vertical transfer electrode 108 can be made as large as about 1.8 µm.

As is apparent from the simulation result shown in FIG. 16, when a read channel width W (=the electrode length L3 of the vertical transfer electrode 108) of the transfer gate portion 110 is 1.8 µm, the read completion voltage is about 13 V. Even in consideration of manufacturing variations, the read of the photodiode 104 can be complete at at least 15 V.

Figure 11:
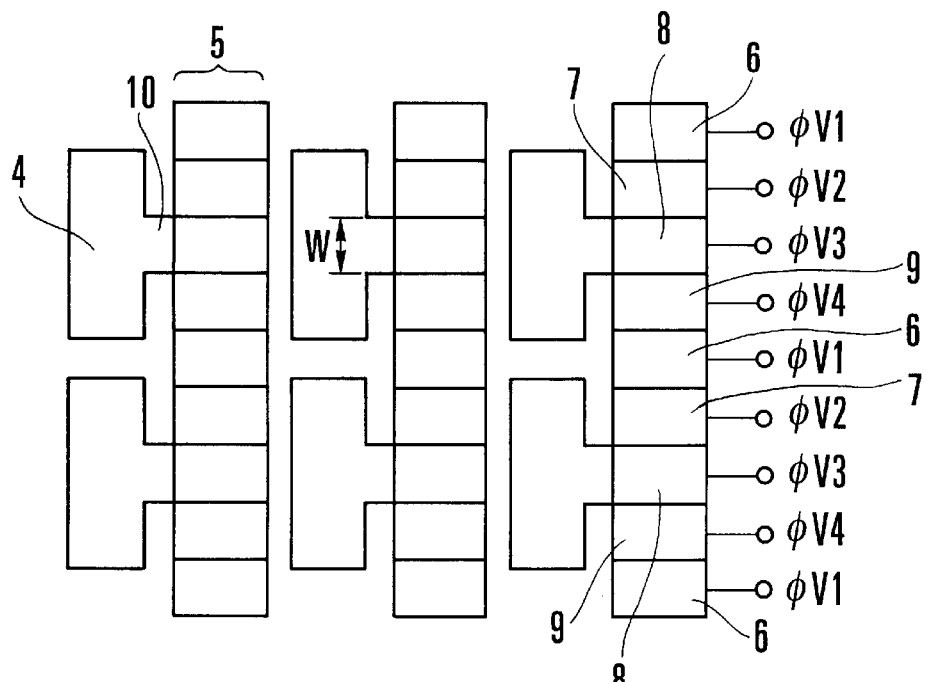
FIG. 11 is a plan view showing the schematic arrangement of photodiodes and vertical CCDs shown in FIG. 10.
Figure 12:
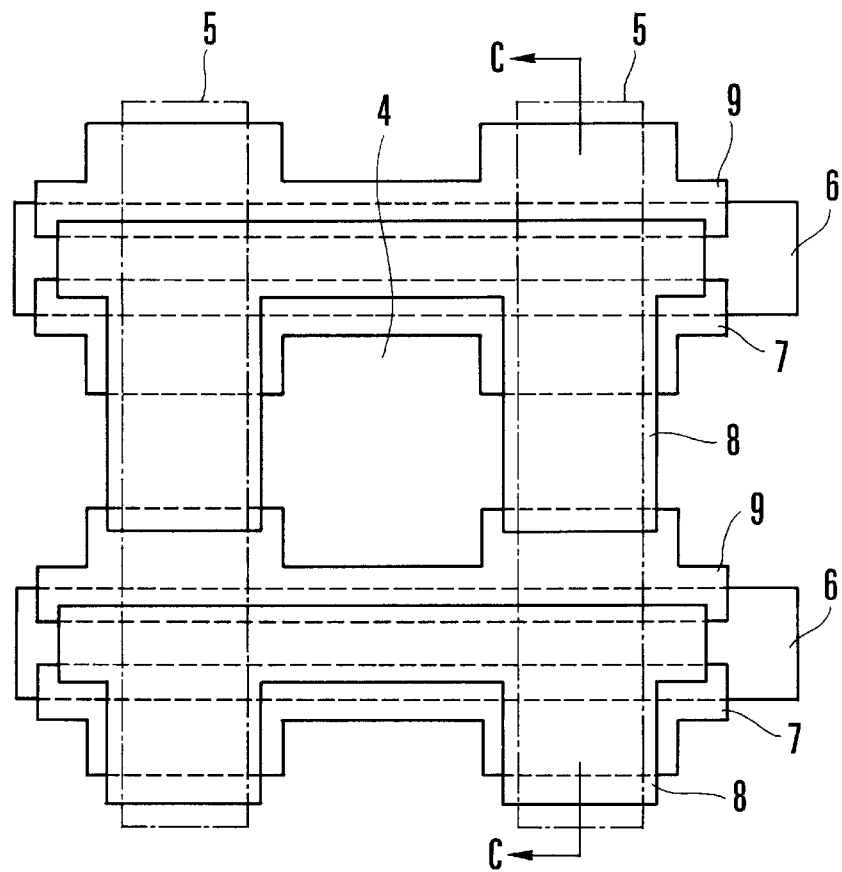
FIG. 12 is an enlarged plan view of the photodiodes and vertical CCDs shown in FIG. 11.
Figure 13:
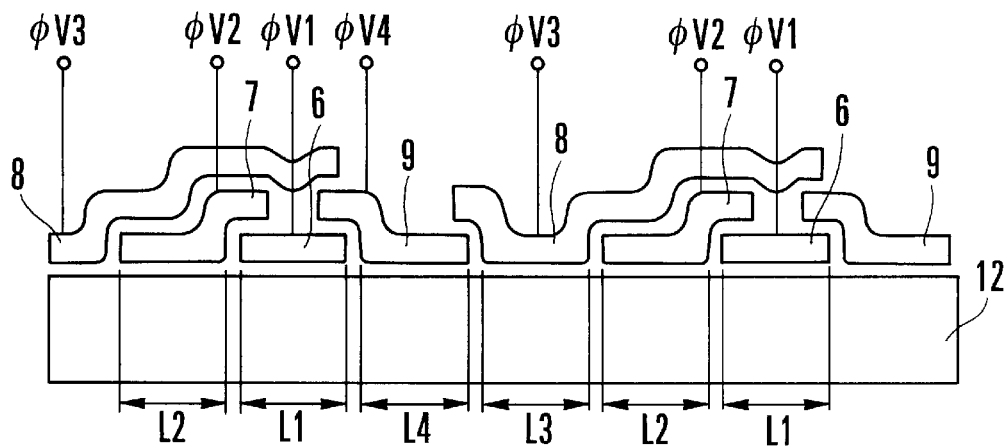
FIG. 13 is a sectional view taken along a line C—C in FIG. 12.

As described above, according to this embodiment, the read completion voltage (high level VH of the driving pulse) can be made lower than that of the conventional solid-state image sensing device shown in FIG. 11. Since the power supply of 15 V is used for a general video camera and the like, the decrease in read completion voltage is very advantageous.

Figures 14A, 14B, 14C, 14D:
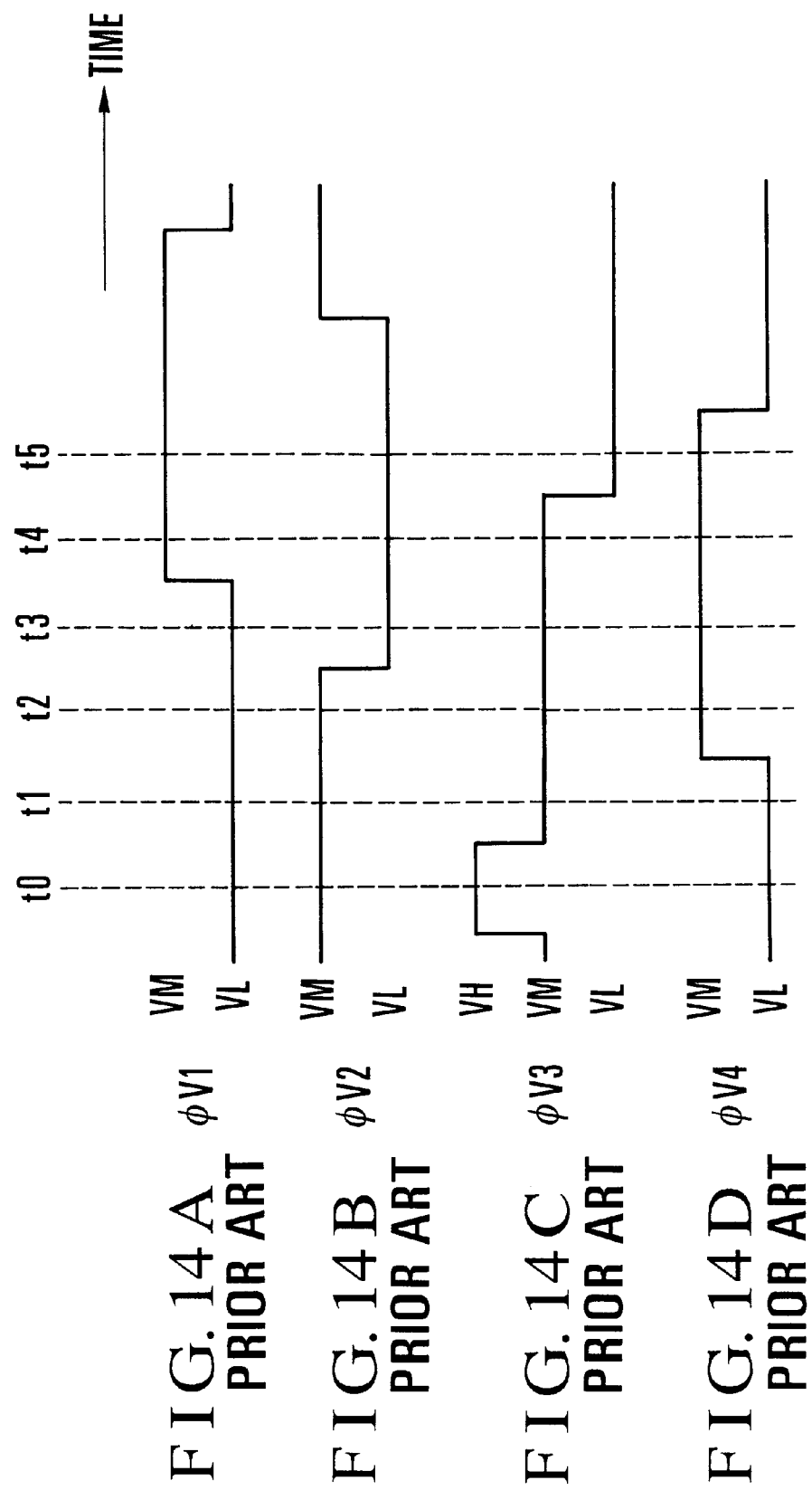
FIGS. 14A to 14D are timing charts showing the waveforms of driving pulses applied to vertical transfer electrodes at the time of read and during the vertical transfer period immediately after the read in the CCD solid-state image sensing devices shown in FIGS. 1 and 10.
Figures 18A, 18B, 18C, 18D, 18E, 18F, 18G:
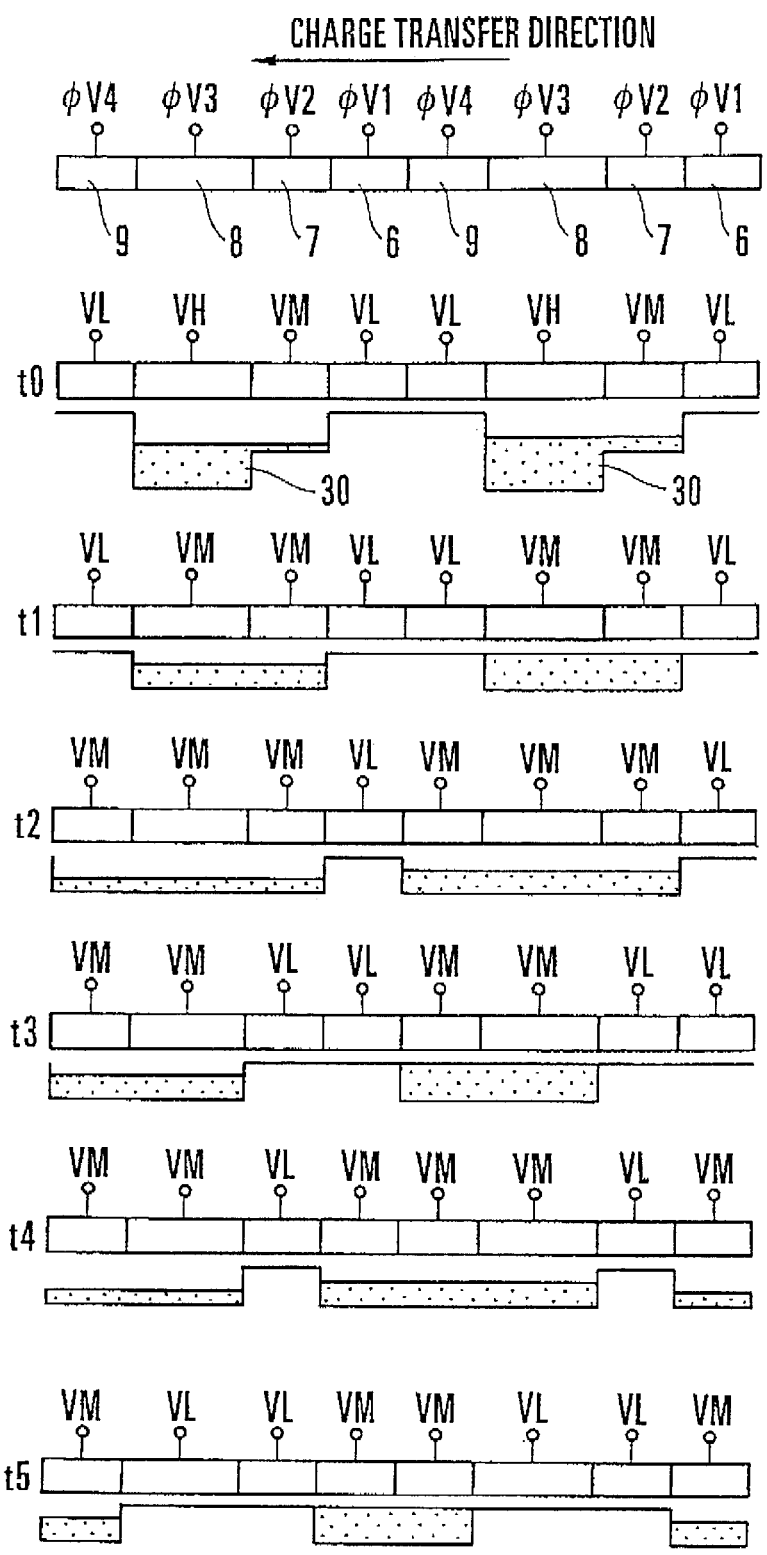
FIGS. 18A to 18G are views showing potentials representing the signal charges storage and transfer states in the solid-state image sensing device shown in FIG. 17.

The method of driving the vertical CCD 105 in the solid-state image sensing device of this embodiment is the same as that of the prior art shown in FIG. 11. This will be described with reference to FIGS. 14A to 14D and 15A to 15G. At time t0, the driving pulse φV3 of high level VH is applied to the vertical transfer electrode 108 also serving as a transfer electrode (FIG. 14C) to read signal charges 30 from the photodiode 104 to the vertical CCD 105, as shown in FIG. 15B. At this time, the driving pulses φV1 and φV4 are at low level VL (FIGS. 14A and 14D), and the driving pulse φV2 is at intermediate level VM (VL<VM<VH) (FIG. 14B).

At time t1, the driving pulse φV3 applied to the vertical transfer electrode 108 is set at intermediate level VM (FIG. 14C), so signal charges are stored only at the lower portions of the vertical transfer electrodes 107 and 108 corresponding to the driving pulses φV2 and φV3, respectively, as shown in FIG. 15C. At time t2, the driving pulse φV4 applied to the vertical transfer electrode 109 is set at intermediate level VM (FIG. 14D), so signal charges are stored only at the lower portions of the vertical transfer electrodes 107, 108, and 109 corresponding to the driving pulses φV2, φV3, and φV4, respectively, as shown in FIG. 15D.

At time t3, the driving pulse φV2 applied to the vertical transfer electrode 107 is set at low level VL (FIG. 14B), so signal charges are stored only at the lower portions of the vertical transfer electrodes 108 and 109 corresponding to the driving pulses φV3 and φV4, respectively, as shown in FIG. 15E. At time t4, the driving pulse φV1 applied to the vertical transfer electrode 106 is set at intermediate level VM (FIG. 14A), so signal charges are stored only at the lower portions of the vertical transfer electrodes 108, 109, and 106 corresponding to the driving pulses φV3, φV4, and φV1, respectively, as shown in FIG. 15F.

At time t5, the driving pulse φV3 applied to the vertical transfer electrode 108 is set at low level VL (FIG. 14C), so signal charges are stored only at the lower portions of the vertical transfer electrodes 109 and 106 corresponding to the driving pulses φV4 and φV1, respectively, as shown in FIG. 15G. By sequentially applying the driving pulses, the signal charges are transferred in the charge transfer direction (vertical direction), as shown in FIG. 15A.

In the solid-state image sensing device of this embodiment, the electrode length L3 of the vertical transfer electrode 108 which is also used as a transfer electrode is increased, and additionally, the electrode lengths of the vertical transfer electrodes 106 to 109 are alternately made equal.

As described above, the maximum transfer charge amount of the vertical CCD 105 is determined by the charge amount to be stored in two electrodes adjacent to each other. Attention need be paid to the fact that since the electrode lengths of the vertical transfer electrodes 106 to 109 are repeatedly set to be large, small, large, small, . . . , the sums of electrode lengths of two arbitrary vertical transfer electrodes adjacent in the vertical transfer direction are always equal. Since the same charge amount as that of the prior art shown in FIG. 11, in which all the four vertical transfer electrodes 6 to 9 have the same electrode length, can be stored, a sufficient dynamic range can be ensured.

If the electrode length L3 of the vertical transfer electrode 108 which also serves as a transfer electrode is made too large, the electrode lengths L2 and L4 of the vertical transfer electrodes 107 and 109 adjacent to the vertical transfer electrode 108 become excessively small accordingly. The reduction restriction of the electrode length will be considered.

The difference between the channel potential at the lower portion of a vertical transfer electrode applied with a driving pulse of low level VL and that of a vertical transfer electrode applied with a driving pulse of intermediate level VM is defined as a potential barrier. The electrode length of the vertical transfer electrode applied with the driving pulse of low level VL is represented by L.

Figure 5:
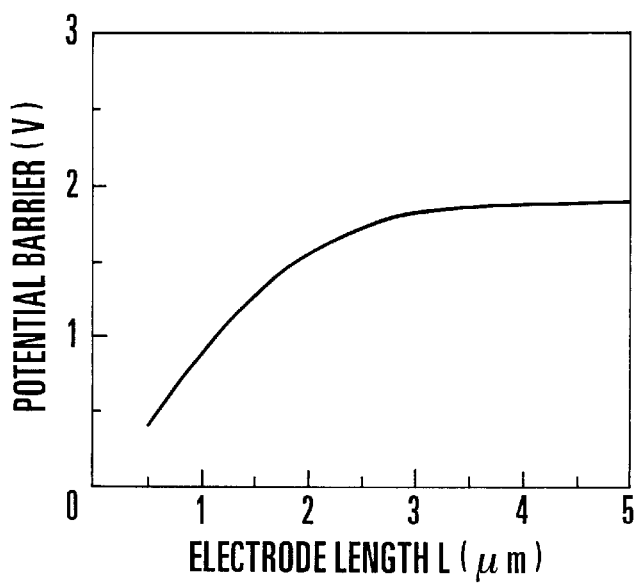
FIG. 5 is a graph showing a simulation result of the dependence of a potential barrier on the electrode length of a vertical transfer electrode.
Figure 10:
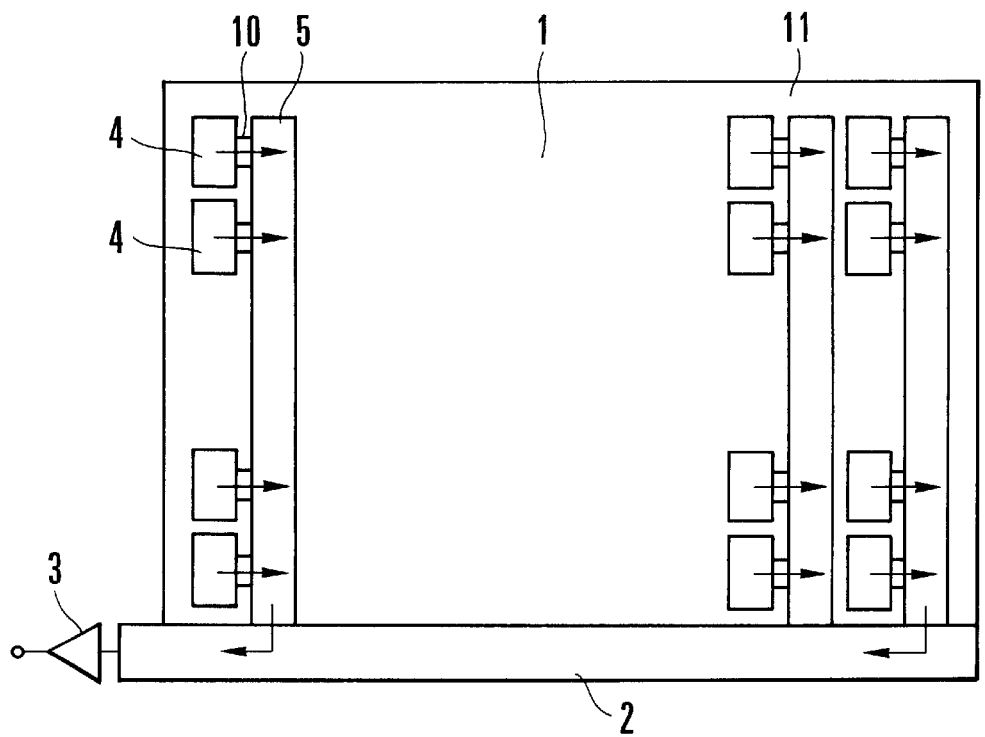
FIG. 10 is a plan view of a conventional all-pixel readout-type interline CCD solid-state image sensing device.

FIG. 5 shows a simulation result of the dependence of the potential barrier on the electrode length L. When the electrode length L of the vertical transfer electrode applied with the driving pulse of low level VL becomes small, and the channel length becomes small, the potential barrier gradually becomes small due to the short channel effect.

FIGS. 6A to 6C explain the reduction restriction of the vertical transfer electrode in the solid-state image sensing device of this embodiment. FIGS. 6B and 6C show the charge storage states at times t3 and t4 in FIGS. 14A to 14D and FIGS. 15A to 15G. The sum of electrode lengths of two vertical transfer electrodes adjacent in the vertical transfer direction is represented by L5; the smaller electrode length of the vertical transfer electrodes, L6 (L2, L4=L6); and the potential barriers at times t3 and t4, H1 and H2, respectively. In FIGS. 6A to 6C, the potential becomes high toward the lower side of the drawings. In other words, the potential with respect to electrons rises toward the upper side of the drawings.

The maximum transfer charge amount is suggested to almost proportional to the product of the height of the potential barrier and storable channel length (in this case, the sum of continuous electrode lengths applied with driving pulses of intermediate level VM). Letting k be the proportional constant, a maximum transfer charge amount Q1 at time t3 is $k \times H1 \times L5$, and a maximum transfer charge amount Q2 at time t4 is $k \times H2 \times (2L5-L6)$.

In the solid-state image sensing device of this embodiment, since the sums of electrode lengths of two vertical transfer electrodes adjacent in the vertical transfer direction are always equal, the sum of electrode lengths of vertical transfer electrodes applied with driving pulses of low level VL is L5. This value does not change even when the electrode length ratio of two, long and short electrodes changes. As is apparent from FIG. 5, the potential barrier H1 always has a predetermined value. Hence, the maximum transfer charge amount Q1 also has always a predetermined value.

In the 3-electrode storage state at time t4 shown in FIG. 6C, the maximum transfer charge amount Q2 depends on the electrode length L6. As is apparent from FIG. 5, when the electrode length L6 becomes small, the potential barrier H2 decreases. Especially, as the electrode length L6 is smaller, the potential barrier H2 abruptly decreases. When the electrode length L6 becomes small, the storable channel length (2L5−L6) increases. If the decrease rate of the potential barrier H2 is higher than the increase rate, the maximum transfer charge amount Q2 decreases. Hence, to ensure a sufficient maximum transfer charge amount, the electrode length L2 must be set to satisfy $Q1 \leq Q2$.

Conventionally, when the electrode length of a vertical transfer electrode is made too large, the fringe field in the transfer direction may weaken to lower the transfer efficiency. For this reason, the electrode length cannot be freely made large. Recently, however, the pixel size is considerably reduced, and therefore, as far as the electrode length per electrode is about 2 $\mu$m or less, the fringe field does not weaken. A transfer frequency of about several ten kHz poses no problems.

Second Embodiment

FIG. 7 shows a CCD solid-state image sensing device according to the second embodiment of the present invention. FIG. 7 shows only 3×2 pixels in the horizontal and vertical directions. The pixel structure is almost the same as in the first embodiment.

More specifically, vertical CCDs 205 having vertical transfer electrodes 206, 207, 208, and 209 of polysilicon are arranged between photodiode lines, as in the first embodiment.

The four vertical transfer electrodes 206 to 209 are commonly formed across the vertical CCDs 205 in units of photodiodes 204. The vertical transfer electrode 208 also serves as a transfer electrode. The sectional structure of the vertical transfer electrodes 206 to 209 is the same as that of the image sensing device of the first embodiment shown in FIGS. 3 and 4.

As the characteristic feature of the solid-state image sensing device of this embodiment, the vertical transfer electrode 208 which is also used as a transfer electrode has the largest electrode length, and the vertical transfer electrode 206 which is not directly adjacent to the vertical transfer electrode 208 has the second largest electrode length. With this arrangement, in the solid-state image sensing device of this embodiment, the electrode length of the transfer electrode 208 can be made as large as 2.0 $\mu$m or more, as compared to the solid-state image sensing device of the first embodiment.

As is apparent from the simulation result shown in FIG. 16, when a read channel width W (=electrode length of the vertical transfer electrode 208) of a transfer gate portion 210 is 2.0 $\mu$m, the read completion voltage is about 12 V. Even in consideration of manufacturing variations, the read of the photodiode 204 is completed at at least 14 V. According to this embodiment, a larger read voltage reduction effect can be obtained, as compared to the first embodiment.

As described in the first embodiment, when the electrode length of the vertical transfer electrode 208 also serving as a transfer electrode is made too large, the electrode lengths of the remaining vertical transfer electrodes excessively becomes small accordingly. This may reduce the transfer charge amount.

In this embodiment, the intermediate level (VM1) of driving pulses $\phi$V1, $\phi$V2, and $\phi$V4 applied to the vertical transfer electrodes 206, 207, and 209 other than the vertical transfer electrode 208 also used as a transfer electrode is set to be higher than the intermediate level (VM2) of a driving pulse $\phi$V3 applied to the vertical transfer electrode 208 also serving as a transfer electrode.

Since the vertical transfer electrode 208 serving as a transfer electrode controls the threshold value of the transfer gate portion 210, the intermediate level VM2 cannot have a predetermined value or more except application of high level VH in the read. This is because when the intermediate level VM2 is increased to a predetermined value or more, charges begin to be read from the photodiode 204 to the vertical CCD 205 upon signal charge transfer.

On the other hand, the value of intermediate level VM1 of the driving pulses $\phi$V1, $\phi$V2, and $\phi$V4 applied to the vertical transfer electrodes 206, 207, and 209 other than the transfer electrode 208 can be increased to some extent without any problems. This is because the left and right portions of each of the vertical transfer electrodes 206, 207, and 209 are surrounded by an element isolation region, as in the first embodiment, and therefore, charges are not read from the photodiode 204 to the vertical CCD 205 even when the voltage is increased to some degree.

That is, the intermediate level VM1 applied to the vertical transfer electrodes 206, 207, and 209 can be increased to almost the threshold value of the element isolation region. This intermediate level VM1 is obviously higher than the intermediate level VM2 which can be applied to the transfer electrode 208.

FIGS. 8A to 8D show the waveforms of the driving pulses applied to the vertical transfer electrodes 206 to 209 at the time of read and during the vertical transfer period immediately after the read in accordance with the above voltage setting. FIGS. 9A to 9G show potentials representing signal charge storage and transfer states at times to t0 t5 in FIGS. 8A to 8D.

As shown in FIG. 8C, when the intermediate level of the driving pulse $\phi$V3 applied to the vertical transfer electrode 208 which also serves as a transfer electrode is VM2, and the intermediate level of the driving pulses $\phi$V1, $\phi$V2, and $\phi$V4 applied to the vertical transfer electrodes 206, 207, and 209 other than the vertical transfer electrode 208 is VM1, VM1>VM2 holds.

The reduction restriction of the shorter vertical transfer electrode in the solid-state image sensing device of this embodiment is almost the same as in the first embodiment. The difference from the first embodiment is as follows. When the charge amount stored at the lower portions of three electrodes where low level VL is applied and the potential barrier becomes small due to the short channel effect, at time t4 in FIG. 9F, is larger than the charge amount stored at the lower portions of two vertical transfer electrodes, at time t1, t3, or t5 in FIG. 9C, 9E, or 9G ($Q1 \leq Q2$), the maximum transfer charge amount does not decrease, unlike the first embodiment, so a sufficient maximum transfer charge amount can be ensured.

According to the present invention, the vertical transfer electrode serving as a transfer electrode for controlling the transfer gate portion has a larger length in the vertical transfer direction than the lengths of two adjacent vertical transfer electrodes, so the read channel width of the transfer gate portion can be increased. Hence, the read completion voltage in reading signal charges from the photoelectric conversion element to the vertical CCD can be lowered, so a camera driven with a low voltage can be realized. In addition, when the electrode lengths of the vertical transfer electrodes are alternately made equal, a predetermined amount of charges can be stored at the lower portions of two arbitrary vertical transfer electrodes adjacent to each other in the vertical transfer direction. For this reason, the maximum transfer charge amount can be prevented from decreasing, and a wide dynamic range can be ensured.

When the length of a shorter vertical transfer electrode of two arbitrary vertical transfer electrodes adjacent to each other is set such that the maximum charge amount which can be stored in the potential well at the lower portions of three vertical transfer electrodes consecutive in the vertical transfer direction becomes equal to or larger than the maximum charge amount which can be stored in the potential well at the lower portions of the two vertical transfer electrodes, the read completion voltage can be lowered without decreasing the maximum transfer charge amount.

When, of the vertical transfer electrodes, the vertical transfer electrode serving as a transfer electrode for controlling the transfer gate portion has the largest electrode length in the vertical transfer direction, the read channel width of the transfer gate portion can be further increased. For this reason, the read completion voltage in reading signal charges from the photoelectric conversion element can be further lowered, as compared to the solid-state image sensing device of claim 1.

Even when the vertical transfer electrode serving as a transfer electrode has the largest length in the vertical transfer direction, the maximum transfer charge amount can be prevented from decreasing, so a wide dynamic range can be ensured. The reason for this is as follows. When the vertical transfer electrode which is not adjacent to the vertical transfer electrode serving as a transfer electrode has the second largest length, and the middle-level voltage applied to the electrodes other than the vertical transfer electrode serving as a transfer electrode is set to be higher than that applied to the vertical transfer electrode serving as a transfer electrode, the transfer charge amount does not decrease, unlike the solid-state image sensing device of claim 1.

What is claimed is:

1. A solid-state image sensing device comprising:
   photoelectric conversion elements two-dimensionally arrayed in a matrix on a semiconductor substrate;
   transfer gate portions respectively arranged adjacent to each of said photoelectric conversion elements to read signal charges stored in said photoelectric conversion element;
   a vertical CCD arranged adjacent to said transfer gate portions to transfer the signal charges read from said photoelectric conversion elements in a vertical direction;
   a horizontal CCD for transferring the signal charges transferred from said vertical CCD in a horizontal direction; and
   a charge detection portion for detecting the signal charges transferred from said horizontal CCD and outputting the signal charges,
   wherein the vertical CCD comprises groups of four vertical transfer electrodes corresponding to respective pixels adjacent to each group of four vertical electrodes, the four vertical transfer electrodes comprising a first vertical electrode that serves as a transfer electrode for controlling the transfer gate portion of a corresponding pixel, a second vertical transfer electrode adjacent the first vertical transfer electrode, a third vertical transfer electrode adjacent the second vertical transfer electrode, and a fourth vertical transfer electrode adjacent the third vertical transfer electrode, and
   wherein, among said vertical transfer electrodes of the group of four vertical electrodes, said first vertical transfer electrode has the largest length, and said third vertical transfer electrode has the second largest length.

2. A device according to claim 1, wherein, when said first vertical transfer electrode is 2.0 µm long, a read voltage applied to the first vertical electrode is not greater than 14 V.

3. A method of driving a solid-state image sensing device, wherein the device comprises:
   photoelectric conversion elements two-dimensionally arrayed in a matrix on a semiconductor substrate,
   transfer gate portions respectively arranged adjacent to each of said photoelectric conversion elements to read signal charges stored in said photoelectric conversion element,
   a vertical CCD arranged adjacent to said transfer gate portion to transfer the signal charges read from said photoelectric conversion element in a vertical direction,
   a horizontal CCD for transferring the signal charges transferred from said vertical CCD in a horizontal direction, and
   a charge detection portion for detecting the signal charges transferred from said horizontal CCD and outputting the signal charges,
   wherein the vertical CCD comprises groups of four vertical transfer electrodes corresponding to respective pixels adjacent to each group of four vertical electrodes, the four vertical transfer electrodes comprising a first vertical electrode that serves as a transfer electrode for controlling the transfer gate portion of a corresponding pixel, a second vertical transfer electrode adjacent the first vertical transfer electrode, a third vertical transfer electrode adjacent the second vertical transfer electrode, and a fourth vertical transfer electrode adjacent the third vertical transfer electrode,
   wherein, among said vertical transfer electrodes of the group of four vertical electrodes, said first vertical transfer electrode has the largest length, and said third vertical transfer electrode has the second largest length, and
   wherein the method comprises:
   reading a pixel by applying a read voltage to a first vertical transfer electrode corresponding to the pixel and applying a first intermediate voltage to a vertical transfer electrode adjacent to the first vertical transfer electrode in a direction opposite a charge transfer direction of said vertical CCD;
   applying a second intermediate voltage to said first vertical transfer electrode, wherein the second intermediate voltage is less than the first intermediate voltage; and
   applying said first intermediate voltage to a second vertical transfer electrode adjacent said first vertical transfer electrode, wherein a maximum charge amount stored in a potential well beneath said first and second vertical transfer electrodes and said vertical transfer electrode adjacent to the first vertical transfer electrode in a direction opposite a charge transfer direction of said vertical CCD is not less than a maximum charge amount stored in a potential well beneath said first vertical transfer electrode and said vertical transfer electrode adjacent to the first vertical transfer electrode in a direction opposite a charge transfer direction of said vertical CCD during said reading.

4. A method according to claim 3, wherein, when said first vertical transfer electrode is 2.0 µm long, said read voltage is not more than 14 V.

5. The method claimed in claim 3, further comprising:
   removing said first intermediate voltage from said vertical transfer electrode adjacent to the first vertical transfer electrode in a direction opposite a charge transfer direction of said vertical CCD;

applying said second intermediate voltage to a third vertical transfer electrode adjacent said second vertical transfer electrode; and applying said second intermediate voltage to a fourth vertical transfer electrode adjacent said second vertical transfer electrode, wherein a maximum charge amount stored in a potential well beneath said second, third and fourth vertical transfer electrodes is not less than a maximum charge amount stored in a potential well beneath said first vertical transfer electrode and said vertical transfer electrode adjacent to the first vertical transfer electrode in a direction opposite a charge transfer direction of said vertical CCD during said reading.

* * * * *